US005507878A

United States Patent [19]

Flaningam et al.

[11] Patent Number: 5,507,878

[45] Date of Patent: Apr. 16, 1996

[54] AZEOTROPES OF OCTAMETHYLTRISILOXANE AND ALIPHATIC OR ALICYCLIC ALCOHOLS

[75] Inventors: Ora L. Flaningam; Dwight E. Williams, both of Midland, Mich.

[73] Assignee: Dow Corning Corporation, Midland, Mich.

[21] Appl. No.: 513,466

[22] Filed: Aug. 10, 1995

Related U.S. Application Data

[62] Division of Ser. No. 427,316, Apr. 24, 1995.

[51] Int. Cl.[6] .......... B08B 3/08; C09K 3/18; C11L 7/26; H05K 3/26

[52] U.S. Cl. .......... 134/42; 134/31; 134/38; 134/40; 252/162; 252/170; 252/171; 252/174.15; 252/194; 252/DIG. 9

[58] Field of Search .......... 252/162, 170, 252/171, 174.15, 194, DIG. 9; 134/38, 40, 42, 31

[56] References Cited

U.S. PATENT DOCUMENTS

| | | | |
|---|---|---|---|
| 2,366,441 | 10/1945 | Daudt | 260/607 |
| 4,155,865 | 5/1979 | Ostrozynski | 252/67 |
| 4,157,976 | 6/1979 | Ostrozynski | 252/67 |
| 4,324,595 | 4/1982 | Kasprzak | 134/38 |
| 4,370,204 | 1/1983 | Kotzsch | 203/39 |
| 4,923,649 | 5/1990 | Hsieh et al. | 264/37 |
| 4,994,202 | 2/1991 | Merchant | 252/172 |
| 5,064,560 | 11/1991 | Merchant | 252/171 |
| 5,316,692 | 5/1994 | John | 252/174.15 |
| 5,454,970 | 10/1995 | Flaningam et al. | 252/174.15 |
| 5,454,972 | 10/1995 | Williams et al. | 252/174.15 |
| 5,456,856 | 10/1995 | Flaningam et al. | 252/174.15 |

FOREIGN PATENT DOCUMENTS

| | | |
|---|---|---|
| 473795 | 3/1992 | European Pat. Off. |
| 61-089269 | 5/1986 | Japan . |
| 6093294 | 4/1994 | Japan . |
| 6136389 | 5/1994 | Japan . |
| 6136388 | 5/1994 | Japan . |
| 602051 | 7/1994 | Japan . |
| 6200294 | 7/1994 | Japan . |
| 6248294 | 9/1994 | Japan . |
| 6-292868 | 10/1994 | Japan . |
| 6313196 | 11/1994 | Japan . |
| 6306390 | 11/1994 | Japan . |
| 6306392 | 11/1994 | Japan . |
| WO9314184 | 7/1993 | WIPO . |
| WO9423091 | 10/1994 | WIPO . |
| WO9423008 | 10/1994 | WIPO . |

OTHER PUBLICATIONS

Radecki et al, Inz. Chem., vol. 5 No. 4, p. 861+, (1975) no month available, English Abstract only.

Radecki et al, Journal of Chemical and Engineering Data, vol. 23 No. 2, pp. 148–150 (1978) no month available.

Radecki et al, Journal of Chemical and Engineering Data, vol. 25 No. 3, pp. 230–232 (1980) no month available.

Guzman, Fluid Phase Equilibria, No. 7, pp. 187–195, (1981) no month available.

Kaczmarek, Polish Journal of Chemistry, 61 (1–3), pp. 267–271, (1987) no month available.

Dickenson et al, *J. Chem. Soc. Faraday Trans I,* vol. 70(12) 1974, pp. 2328–2337 (no month available).

Killgore et al, Journal of Chemical and Engineering Data, vol. 11 No. 4, pp. 535–537 (Oct. 1966).

Guzman, Diss. Abstr. Intl. B, vol. 34 No. 5, pp. 2000B–2001B, (1973) no month available.

Radecki et al, Journal of Chemical and Engineering Data, vol. 20 No. 4, pp. 378–381, (1975) no month available.

*Primary Examiner*—Linda Skaling Therkorn
*Attorney, Agent, or Firm*—James L. DeCesare

[57] ABSTRACT

Binary azeotropic and azeotrope-like compositions contain 1-heptanol, cyclohexanol, or 4-methylcyclohexanol, with octamethyltrisiloxane, and the compositions are useful for cleaning, rinsing, or drying.

8 Claims, No Drawings

AZEOTROPES OF OCTAMETHYLTRISILOXANE AND ALIPHATIC OR ALICYCLIC ALCOHOLS

RELATED AND COMMONLY ASSIGNED US APPLICATIONS

"This is a divisional of application Ser. No. 08/427316 filed on 4/24/95."

In Ser. No. 08/260,423, filed Jun. 15, 1994, we describe azeotropes of hexamethyldisiloxane (MM) with 3-methyl-3-pentanol, 2-pentanol, or 1-methoxy-2-propanol. A second application Ser. No. 08/289,360, filed Aug. 11, 1994, now U.S. Pat. No. 5,454,970, describes azeotropes of octamethyltrisiloxane (MDM) with 2-methyl-1-pentanol; 1-hexanol; 1-butoxy-2-propanol; or ethyl lactate. A third application Ser. No. 08/306,293, filed Sep. 15, 1994, now U.S. Pat. No. 5,454,972, describes azeotropes of octamethyltrisiloxane and n-propoxypropanol. A fourth application Ser. No. 08/322,643, filed Oct. 13, 1994, describes methods of cleaning or dewatering surfaces using azeotropes as rinsing agent. A fifth application Ser. No. 08/374,316, filed Jan. 18, 1995, now U.S. Pat. No. 5,456,856 describes azeotropes of octamethyltrisiloxane and 2-butoxyethanol, 2-methylcyclohexanol, or isopropyl lactate.

BACKGROUND OF THE INVENTION

This invention is directed to environmentally friendly solvents, and particularly to cleaning, rinsing, and drying agents which are binary azeotropic or azeotrope-like compositions containing a volatile methyl siloxane (VMS).

Since local, state, federal, and international regulations, have restricted the use of some chemicals, a search is on for replacement solvents. VMS have been found to be one suitable solvent replacement. The Environmental Protection Agency (EPA) has determined that volatile methyl siloxanes such as octamethylcyclotetrasiloxane, decamethylcyclopentasiloxane, dodecamethylcyclohexasiloxane, hexamethyldisiloxane, octamethyltrisiloxane, and decamethyltetrasiloxane, are acceptable substitutes for CFC-113, the chlorofluorocarbon ($C_2Cl_3F_3$), and methylchloroform (MCF). This is limited to closed systems for metal cleaning, electronic cleaning, and precision cleaning applications, under their Significant New Alternatives Policy (SNAP).

In addition, EPA has excluded VMS as a volatile organic compound (VOC). The EPA added VMS to the list of compounds in 40 CFR 51.100(s) excluded from the definition of VOC, on the basis that VMS compounds have negligible contribution to tropospheric ozone formation. They pointed out that exempting VMS from regulation as ozone precursors contributes to the achievement of several important environmental goals, and that VMS might be used as a substitute for several compounds listed as hazardous air pollutants (HAP). As they explained, that met the need to develop substitutes for ozone depleting substances (ODS) and attained National Ambient Air Quality Standards for ozone under Title I of the Clean Air Act.

Compounds designated VMS by EPA exemption are cyclic, branched, or linear, "completely methylated" siloxanes. "Completely methylated" means that methyl groups and no other functional groups are attached to the central backbone of the siloxane.

Volatile methyl siloxanes have an atmospheric lifetime of 10–30 days and do not contribute significantly to global warming. They have no potential to deplete stratospheric ozone due to short atmospheric lifetimes, so they do not rise and accumulate in the stratosphere. VMS contain no chlorine or bromine atoms; they do not attack the ozone layer; they do not contribute to tropospheric ozone formation (Smog); and they have minimum GLOBAL WARMING potential. VMS are hence unique in simultaneously possessing these attributes. It should be apparent that VMS provide one positive solution to the problem of finding new solvent replacements.

SUMMARY OF THE INVENTION

The invention relates to new binary azeotropic compositions containing a volatile methyl siloxane and an aliphatic or alicyclic alcohol. Azeotrope-like compositions were also discovered. The azeotropic and azeotrope-like compositions have utility as environmentally friendly cleaning, rinsing, and drying agents.

As cleaning agents, the compositions can be used to remove contaminants from any surface, but especially in defluxing and precision cleaning, low-pressure vapor degreasing, and vapor phase cleaning. As cleaning agents, the compositions exhibit unexpected advantages in their enhanced solvency power, and maintenance of a constant solvency power following evaporation, which can occur during applications involving vapor phase cleaning, distillation regeneration, and wipe cleaning.

Because the cleaning agent is azeotropic or azeotrope-like composition, it has another advantage in being easily recovered and recirculated. Thus, the composition can be separated as a single substance from a contaminated cleaning bath after its use in the cleaning process. By simple distillation, its regeneration is facilitated so that it can be freshly recirculated.

In addition, these compositions provide the unexpected benefit in being higher in siloxane fluid content and correspondingly lower in alcohol content, than azeotropes of siloxane fluids and low molecular weight alcohols such as ethanol. The surprising result is that the compositions are less inclined to generate tropospheric ozone and smog. Another surprising result in using these compositions is that they possess an enhanced solvency power compared to the volatile methyl siloxane itself. Yet, the compositions exhibit a mild solvency power making them useful for cleaning delicate surfaces without harm.

These and other objects will become apparent from considering the detailed description.

DETAILED DESCRIPTION OF THE INVENTION

An azeotrope is a mixture of two or more liquids, the composition of which does not change upon distillation. Thus, a mixture of 95% ethanol and 5% water boils at a lower temperature (78.15° C.) than pure ethanol (78.3° C.) or pure water (100° C.). Such liquid mixtures behave like a single substance in that the vapor produced by partial evaporation of liquid has the same composition as the liquid. Thus, the mixtures distill at a constant temperature without change in composition and cannot be separated by normal distillation.

Azeotropes can exist in systems containing two liquids (A and B) as binary azeotropes, three liquids (A, B, and C) as ternary azeotropes, and four liquids (A, B, C, and D) as quaternary azeotropes. However, azeotropism an unpredictable phenomenon and each azeotropic or azeotrope-like composition must be discovered. The unpredictability of azeotrope formation is well documented in U.S Pat. Nos. 3085065, 4155865, 4157976, 4994202, and 5064560. One of ordinary skill in the art cannot predict or expect azeotrope formation, even among positional or constitutional isomers (i.e. butyl, isobutyl, sec-butyl, and tert-butyl).

For purposes of our invention, a mixture of two or more components is azeotropic if it vaporizes with no change in the composition of the vapor from the liquid. Specifically, azeotropic includes mixtures that boil without changing composition, and mixtures that evaporate at a temperature below their boiling point without changing composition. Accordingly, an azeotropic composition may include mixtures of two components over a range of proportions where each specific proportion of the two components is azeotropic at a certain temperature but not necessarily at other temperatures.

Azeotropes vaporize with no change in composition. If the applied pressure is above the vapor pressure of the azeotrope, it evaporates without change. If the applied pressure is below the vapor pressure of the azeotrope, it boils or distills without change. The vapor pressure of low boiling azeotropes is higher, and the boiling point is lower, than the individual components. In fact, the azeotropic composition has the lowest boiling point of any composition of its components. Thus, an azeotrope can be obtained by distillation of a mixture whose composition initially departs from that of the azeotrope.

Since only certain combinations of components form azeotropes, the formation of an azeotrope cannot be found without experimental vapor-liquid-equilibria (VLE) data, that is vapor and liquid compositions at constant total pressure or temperature, for various mixtures of the components. The composition of some azeotropes is invariant to temperature, but in many cases, the azeotropic composition shifts with temperature. As a function of temperature, the azeotropic composition can be determined from high quality VLE data at a given temperature. Commercial software such as the ASPENPLUS® program of Aspen Technology. Inc., Cambridge, Mass., is available to make such determinations. Given experimental data, programs such as ASPENPLUS® can calculate parameters from which complete tables of composition and vapor pressure may be generated. This allows one to determine where an azeotropic composition is located.

The art also recognizes the existence of azeotrope-like compositions. For purposes of our invention, azeotrope-like means a composition that behaves like an azeotrope. Thus, azeotrope-like compositions have constant boiling characteristics, or have a tendency not to fractionate upon boiling or evaporation. In an azeotrope-like mixture, the composition of the vapor formed during boiling or evaporation is identical or substantially identical to the composition of the original liquid. During boiling or evaporation, the liquid changes only minimally, or to a negligible extent, if it changes at all. In other words, it has about the same composition in vapor phase as in liquid phase when employed at reflux. In contrast, the liquid composition of non-azeotrope-like mixtures change to a substantial degree during boiling or evaporation. Azeotrope-like compositions include all ratios of the azeotropic components boiling within one ° C. of the minimum boiling point at 760 Torr (101.1 kPa).

One component of our azeotropic and azeotrope-like composition is octamethyltrisiloxane $(CH_3)_3SiO(CH_3)_2SiOSi(CH_3)_3$. It has a viscosity of one centistoke ($mm^2/s$) at 25° C., and is often referred to as "MDM" because it contains one difunctional "D" unit $(CH_3)SiO_{2/2}$ and two monofunctional "M" units $(CH_3)_3SiO_{1/2}$ shown below.

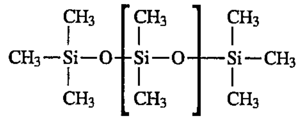

MDM is a clear fluid, essentially odorless, nontoxic, nongreasy, nonstinging, and nonirritating to skin. It leaves no residue after 30 minutes at room temperature (20°–25° C./68°–77° F.) when one gram is placed at the center of No. 1 circular filter paper (diameter 185 mm supported at its perimeter in open room atmosphere).

The other component of our azeotropic and azeotrope-like composition is an aliphatic or alicyclic alcohol. The aliphatic alcohol is 1-heptanol $CH_3(CH_2)_5CH_2OH$. One allcyclic alcohol is cyclohexanol $C_6H_{11}OH$. The other alicyclic alcohol is 4-methylcyclohexanol $CH_3C_6H_{10}OH$ as a mixture of its "cis" and "trans" forms. The boiling points of these liquids in ° C. measured at standard barometric pressure (101.3 kPa/760 mm Hg) are 152.6° for MDM; 176.6° for 1-heptanol; 161° for cyclohexanol; and 171° for 4-methylcyclohexanol.

New binary azeotropic compositions were discovered containing (i) 2–9% by weight 1-heptanol and 91–98% by weight octamethyltrisiloxane; (ii) 2–26% by weight cyclohexanol and 74–98% by weight octamethyltrisiloxane; and (iii) 1–12% by weight 4-methylcyclohexanol and 88–99% by weight octamethyltrisiloxane. These compositions were homogeneous and had a single liquid phase at the azeotropic temperature and at room temperature. Homogeneous azeotropes are more desirable than heterogeneous azeotropes especially for cleaning, because homogeneous azeotropes exist as one liquid phase instead of two. In contrast, each phase of a heterogeneous azeotrope differs in cleaning power. Therefore, cleaning performance of a heterogeneous azeotrope is difficult to reproduce, because it depends on consistent mixing of the phases. Single phase (homogeneous) azeotropes are also more useful than multi-phase (heterogeneous) azeotropes since they can be transferred between locations with facility.

Each homogeneous azeotrope we discovered existed over a particular temperature range. Within that range, the azeotropic composition shifted with temperature. Compositions containing the three alcohols were azeotropic within the range of 75–162.4° C. inclusive. The following example illustrates our invention.

EXAMPLE I

We used a single-plate distillation apparatus for measuring vapor-liquid equilibria. The liquid mixture was boiled and the vapor was condensed in a small receiver. The receiver had an overflow path for recirculation to the boiling liquid. When equilibrium was established, samples of boiling liquid and condensed vapor were separately removed, and quantitatively analyzed by gas chromatography (GC). The temperature, ambient pressure, and liquid-vapor compositions, were measured at several different initial composition points. This data was used to determine if an azeotropic or azeotrope-like composition existed. The composition at different temperatures was determined using the data with the ASPENPLUS® software program which performed the quantitative determinations. Our new azeotropic compositions are shown in Tables I–III. In the tables, "MDM" is weight percent octamethyltrisiloxane in the azeotrope. Vapor pressure (VP) is Torr pressure units where one Torr is 0.133 kPa (1 mm Hg). Accuracy in determining these compositions was ±2% by weight.

TABLE I

| ALCOHOL | TEMPERATURE °C. | VP (Torr) | WEIGHT % MDM |
|---|---|---|---|
| 1-heptanol | 162.4 | 1000 | 91 |
| | 152.1 | 760 | 93 |
| | 135 | 360.2 | 98 |

TABLE II

| ALCOHOL | TEMPERATURE °C. | VP (Torr) | WEIGHT % MDM |
|---|---|---|---|
| cyclohexanol | 156.6 | 1000 | 74 |
| | 147 | 760 | 76 |
| | 125 | 380.6 | 81 |
| | 100 | 154.6 | 89 |
| | 75 | 54.9 | 98 |

TABLE III

| ALCOHOL | TEMPERATURE °C. | VP (Torr) | WEIGHT % MDM |
|---|---|---|---|
| 4-methylcyclohexanol | 161.9 | 1000 | 88 |
| | 151.9 | 760 | 91 |
| | 125 | 345.8 | 99 |

These tables show that at different temperatures, the composition of a given azeotrope varies. Thus, an azeotrope represents a variable composition which depends on temperature.

We also discovered azeotrope-like compositions containing octamethyltrisiloxane and 1-heptanol, cyclohexanol, or 4-methylcyclohexanol. Azeotrope-like compositions of octamethyltrisiloxane and 1-heptanol were found at 760 Torr (101.1 kPa) vapor pressure for all ratios of the components, where the weight percent 1-heptanol varied between 1–22% and the weight percent octamethyltrisiloxane varied between 78–99%. These azeotrope-like compositions had a normal boiling point (the boiling point at 760 Torr) that was within one ° C. of 152.1° C., which is the normal boiling point of the azeotrope itself.

Azeotrope-like compositions of octamethyltrisiloxane and cyclohexanol were found at 760 Torr (101.1 kPa) vapor pressure for all ratios of the components, where the weight percent cyclohexanol varied between 11–46% and the weight percent octamethyltrisiloxane varied between 54–89%. These azeotrope-like compositions had a normal boiling point that was within one ° C. of 147° C., which is the normal boiling point of the azeotrope itself.

Azeotrope-like compositions of octamethyltrisiloxane and 4-methylcyclohexanol were found at 760 Torr (101.1 kPa) vapor pressure for all ratios of the components, where the weight percent 4-methylcyclohexanol varied between 1–26% and the weight percent octamethyltrisiloxane varied between 74–99%. These azeotropeolike compositions had a normal boiling point that was within one ° C. of 151.9° C., which is the normal boiling point of the azeotrope itself.

The procedure for determining these azeotrope-like compositions was the same as Example I. The azeotrope-like compositions were homogeneous and have the same utility as their azeotropic compositions.

An especially useful application of our azeotropic and azeotrope-like compositions is cleaning and removing fluxes used in mounting and soldering electronic parts on printed circuit boards. Solder is often used in making mechanical, electro-mechanical, or electronic connections. In making electronic connections, components are attached to conductor paths of printed wiring assemblies by wave, reflow, or manual soldering. The solder is usually a tin-lead alloy used with a rosin-based flux. Rosin is a complex mixture of isomeric acids, principally abietic acid, and rosin fluxes often contain activators such as amine hydro-halides and organic acids. The flux (i) reacts with and removes surface compounds such as oxides, (ii) it reduces the surface tension of the molten solder alloy, and (iii) it prevents oxidation during the heating cycle by providing a surface blanket to the base metal and solder alloy. After the soldering operation, it is usually necessary to clean the assembly.

The compositions of our invention are useful as cleaners. They remove corrosive flux residues formed on areas unprotected by the flux during soldering, or residues which could cause malfunctioning and short circuiting of electronic assemblies. In this application, our compositions can be used as cold cleaners, vapor degreasers, or ultrasonically. The compositions can also be used to remove carbonaceous materials from the surface of these and other industrial articles. By carbonaceous material is meant any carbon containing compound or mixture of carbon containing compounds soluble in common organic solvents such as hexane, toluene, or 1,1,1-trichloroethane.

We used four azeotropic compositions for cleaning a rosin-based solder flux as soil. Cleaning tests were conducted at 22° C. in an open bath with no distillation recycle of the composition. The four compositions contained 7% 1-heptanol, 9% 4-methylcyclohexanol, 11% cyclohexanol, and 26% cyclohexanol. The compositions removed flux although they were not equally effective. This is illustrated in the following example.

EXAMPLE II

We used an activated rosin-based solder flux commonly used for electrical and electronic assemblies. It was KESTER No. 1544, a product of Kester Solder Division-Litton Industries, Des Plaines, Ill. Its approximate composition is 50% by weight modified rosin, 25% by weight ethanol, 25% by weight 2-butanol, and 1% by weight proprietary activator. The rosin flux was mixed with 0.05% by weight of nonreactive low viscosity silicone glycol flow-out additive. A uniform thin layer of the mixture was applied to a 2"×3" (5.1×7.6 cm) area of an Aluminum Q panel and spread out evenly with the edge of a spatula. The coating was allowed to dry at room temperature and cured at 100° C. for 10 minutes in an air oven. The panel was placed in a large magnetically stirred beaker filled one-third with azeotrope. Cleaning was conducted while rapidly stirring at room temperature even when cleaning with higher temperature azeotropes. The panel was removed at timed intervals, dried at room temperature, weighed, and re-immersed for additional cleaning. The initial coating weight and weight loss were measured as functions of cumulative cleaning time and shown in Table IV.

In Table IV, 1-heptanol is "HEPTANOL"; cyclohexanol is "CYCLOHEX"; and 4-methylcyclohexanol is "4-METHYL". "WT %" is weight percent of alcohol. "TEMP" is azeotropic temperature in ° C. "WT" is initial weight of the coating in grams. "Time" is cumulative time after 1, 5, 10, and 30 minutes. Composition No. 5 is a CONTROL of 100% by weight octamethyltrisiloxane used for comparison. Table IV shows that our azeotropic compositions 1–4 were more effective cleaners than CONTROL No. 5.

TABLE IV

CLEANING EXTENT AT ROOM TEMPERATURE (22° C.)

| | | | | | % REMOVED (Time-min) | | | |
|---|---|---|---|---|---|---|---|---|
| No. | WT % | LIQUIDS | TEMP | WT | 1 | 5 | 10 | 30 |
| 1 | 7% | HEPTANOL | 152.1 | 0.3104 | −2.1 | 77.7 | 87.0 | 94.4 |
| 2 | 11% | CYCLOHEX | 100.0 | 0.3132 | 13.1 | 86.4 | 90.7 | 94.1 |
| 3 | 26% | CYCLOHEX | 156.6 | 0.3246 | 19.8 | 95.9 | 99.3 | 100.0 |
| 4 | 9% | 4-METHYL | 151.8 | 0.3258 | −1.1 | 40.7 | 80.7 | 90.7 |
| 5 | 0% | 100% MDM | — | 0.3260 | 0.0 | 2.8 | 7.0 | 21.0 |

Our azeotropic and azeotrope-like compositions have several advantages for cleaning, rinsing, or drying. They can be regenerated by distillation so performance of the cleaning mixture is restored after periods of use. Other performance factors affected by the compositions are bath life, cleaning speed, lack of flammability when one component is non-flammable, and lack of damage to sensitive parts. In vapor phase degreasing, the compositions can be restored by continuous distillation at atmospheric or reduced pressure, and continually recycled. In such applications, cleaning or rinsing can be conducted at the boiling point by plunging the part into the boiling liquid, or allowing the refluxing vapor to condense on the cold part. Alternatively, the part can be immersed in a cooler bath continually fed with fresh condensate, while dirty overflow liquid is returned to a sump. In the later case, the part is cleaned in a continually renewed liquid with maximum cleaning power.

When used in open systems, their composition and performance remain constant even though evaporative losses occur. Such systems can be operated at room temperature as ambient cleaning baths or wipe-on-by-hand cleaners. Cleaning baths can also be operated at elevated temperatures but below their boiling point; since cleaning, rinsing, or drying, often occur faster at elevated temperature, and are desirable when the part being cleaned and equipment permit.

Our compositions are beneficial when used to rinse water displacement fluids from (i) mechanical and electrical parts such as gear boxes or electric motors, and (ii) other articles made of metal, ceramic, glass, and plastic, such as electronic and semiconductor parts; precision parts such as ball bearings; optical parts such as lenses, photographic, or camera parts; and military or space hardware such as precision guidance equipment used in defense and aerospace industries. Our compositions are effective as rinsing fluid, even though most water displacement fluids contain small amounts of one or more surfactants, and our compositions (i) more thoroughly remove residual surfactant on the part; (ii) reduce carry-over loss of rinse fluid; and (iii) increase the extent of water displacement.

Cleaning can be conducted by using a given azeotropic or azeotrope-like composition at or near its azeotropic temperature or at some other temperature. It can be used alone, or combined with small amounts of one or more organic liquid additives capable of enhancing oxidative stability, corrosion inhibition, or solvency. Oxidative stabilizers in amounts of about 0.05–5% by weight inhibit slow oxidation of organic compounds such as alcohols. Corrosion inhibitors in amounts of about 0.1–5% by weight prevent metal corrosion by traces of acids that may be present or slowly form in alcohols. Solvency enhancers in amounts of about 1–10% by weight increase solvency power by adding a more powerful solvent.

These additives can mitigate undesired effects of alcohol components of the azeotropic and azeotrope-like composition, since the alcohol is not as resistant to oxidative degradation as the volatile methyl siloxane. Numerous additives are suitable as the VMS is miscible with small amounts of many additives. The additive, however, must be one in which the resulting liquid mixture is homogeneous and single phased, and one that does not significantly affect the azeotropic or azeotrope-like character of the composition.

Useful oxidative stabilizers are phenols such as trimethylphenol, cyclohexylphenol, thymol, 2,6-di-t-butyl-4-methylphenol, butylhydroxyanisole, and isoeugenol; amines such as hexylamine, pentylamine, dipropylamine, diisopropylamine, diisobutylamine, triethylamine, tributylamine, pyridine, N-methylmorpholine, cyclohexylamine, 2,2,6,6-tetramethylpiperidine, and N,N'-diallyl-p-phenylenediamine; and triazoles such as benzotriazole, 2-(2'-hydroxy-5'-methylphenyl )benzotriazole, and chlorobenzotriazole.

Useful corrosion inhibitors are acetylenic alcohols such as 3-methyl-1-butyn-3-ol, and 3-methyl-1-pentyn-3-ol; epoxides such as glycidol, methyl glycidyl ether, allyl glycidyl ether, phenyl glycidyl ether, 1.2-butylene oxide, cyclohexene oxide, and epichlorohydrin; ethers such as dimethoxymethane, 1,2-dimethoxyethane, 1,4-dioxane, and 1,3,5-trioxane: unsaturated hydrocarbons such as hexene, heptene, octene, 2,4,4-trimethyl-1-pentene, pentadiene, octadiene, cyclohexene, and cyclopentene; olefin based alcohols such as allyl alcohol, and 1-butene-3-ol; and acrylic acid esters such as methyl acrylate, ethyl acrylate, and butyl acrylate.

Useful solvency enhancers are hydrocarbons such as pentane, isopentane, hexane, isohexane, and heptane; nitroalkanes such as nitromethane, nitroethane, and nitropropane; amines such as diethylamine, triethylamine, isopropylamine, butylamine, and isobutylamine; alcohols such as methanol, ethanol, n-propyl alcohol, isopropyl alcohol, n-butanol, and isobutanol; ethers such as methyl Cellosolve®, tetrahydrofuran, and 1,4-dioxane; ketones such as acetone, methyl ethyl ketone, and methyl butyl ketone; and esters such as ethyl acetate, propyl acetate, and butyl acetate.

Other variations may be made in compositions and methods described without departing from the essentials of the invention. The forms of invention are exemplary and not limitations on its scope.

That which is claimed is:

1. A method of cleaning, rinsing, or drying the surface of an article comprising applying to the surface an azeotropic or azeotrope-like composition consisting essentially of:

(a) about 91–98% by weight octamethyltrisiloxane and about 2–9% by weight 1-heptanol, wherein the composition is homogenous and azeotropic at a temperature within the range of about 135°–162.4° C. inclusive, wherein the composition has a vapor pressure of about 360.2 Torr at 135° C. when the composition consists essentially of 98% by weight octamethyltrisiloxane and 2% by weight 1-heptanol, and wherein the composition has a vapor pressure of about 1,000 Torr at 162.4° C. when the composition consists essentially of 91% by weight octamethyltrisiloxane and 9% by weight 1-heptanol; or (b) about 74–98% by weight octamethyltrisiloxane and about 2–26% by weight cyclohexanol, wherein the composition is homogenous and azeotropic at a temperature within the range of about 75°–156.6° C. inclusive, wherein the composition has a vapor pressure of about 54.9 Torr at 75° C. when the composition consists essentially of 98% by weight octamethyltrisiloxane and 2% by weight cyclohexanol, and wherein the composition has a vapor pressure of about 1,000 Torr at 156.6° C. when the composition consists essentially of 74% by weight octamethyltrisiloxane and 26% by weight cyclohexanol; or (c) about 88–99% by weight octamethyltrisiloxane and about 1–12% by weight 4-methylcyclohexanol, wherein the composition is homogenous and azeotropic at a temperature within the range of about 125°–161.9° C. inclusive, wherein the composition has a vapor pressure of about 345.8 Torr at 125° C. when the composition consists essentially of 99% by weight octamethyltrisiloxane and 1% by weight 4-methylcyclohexanol, and wherein the composition has a vapor pressure of about 1,000 Torr at 161.9° C. when the composition consists essentially of 88% by weight octamethyltrisiloxane and 12% by weight 4-methylcyclohexanol.

2. A method of cleaning, rinsing, or drying the surface of an article comprising applying to the surface an azeotropic or azeotrope-like composition consisting essentially of:

(a) about 78–99% by weight octamethyltrisiloxane and about 1–22% by weight 1-heptanol, wherein the composition is homogeneous and azeotrope-like at a temperature within one degree of 152.1° C. at 760 Torr; or (b) about 54–89% by weight octamethyltrisiloxane and about 11–46% by weight cyclohexanol, wherein the composition is homogeneous and azeotrope-like at a temperature within one degree of 147° C. at 760 Torr; or (c) about 74–99% by weight octamethyltrisiloxane and about 1–26% by weight 4-methylcyclohexanol, wherein the composition is homogeneous and azeotrope-like at a temperature within one degree of 151.9° C. at 760 Torr.

3. The method according to claim 1 in which the composition consists essentially of 91–98% by weight octamethyltrisiloxane and 2–9% by weight 1-heptanol.

4. The method according to claim 2 in which the composition consists essentially of 78–99% by weight octamethyltrisiloxane and 1–22% by weight 1-heptanol.

5. The method according to claim 1 in which the composition consists essentially of 74–98% by weight octamethyltrisiloxane and 2–26% by weight cyclohexanol.

6. The method according to claim 2 in which the composition consists essentially of 54–89% by weight octamethyltrisiloxane and 11–46% by weight cyclohexanol.

7. The method according to claim 1 in which the composition consists essentially of 88–99% by weight octamethyltrisiloxane and 1–12% by weight 4-methylcyclohexanol.

8. The method according to claim 2 in which the azeotrope-like composition consists essentially of 74–99% by weight octamethyltrisiloxane and 1–26% by weight 4-methylcyclohexanol.

* * * * *